United States Patent [19]

Saari

[11] 4,441,080

[45] Apr. 3, 1984

[54] AMPLIFIER WITH CONTROLLED GAIN

[75] Inventor: Veikko R. Saari, Spring Lake Heights, N.J.

[73] Assignee: Bell Telephone Laboratories, Incorporated, Murray Hill, N.J.

[21] Appl. No.: 331,513

[22] Filed: Dec. 17, 1981

[51] Int. Cl.³ .............................................. H03G 3/20
[52] U.S. Cl. ..................................... 330/86; 330/107; 330/149; 330/282
[58] Field of Search ................... 330/86, 282, 51, 107, 330/149 US

[56] References Cited

U.S. PATENT DOCUMENTS 4,179,665 12/1979 Gregorian ........................... 330/107

OTHER PUBLICATIONS

Caves et al., "Sampled Analog Filtering Using Switched Capacitors as Resistor Equivalents", *IEEE J. of Solid State Circuits*, vol. SC-12, No. 6, pp. 592–599.
Locke; L., "Wideband Variable Gain Amplifier", *New Electronics*, vol. 10, No. 5, p. 64, Mar. 8, 1977.

*Primary Examiner*—James B. Mullins
*Assistant Examiner*—Steven J. Mottola
*Attorney, Agent, or Firm*—Volker R. Ulbrich

[57] ABSTRACT

Amplifier gain is varied in response to a control voltage by a switched capacitor variable transconductance feedback network. First and second capacitors are connected in series between the input and the output of an operational amplifier. The input side of the first capacitor is switched by a first toggle switch between the input and ground. The output side of the second capacitor is switched by a second toggle switch between the output side and ground. Both toggle switches are operated by a pair of non-overlapping pulse trains. A voltage-controlled variable resistance network is connected between the common node of the capacitors and ground. It includes a first enhancement mode NMOS transistor having its source connected to the common node and its gate and drain connected to ground, together with an enhancement mode NMOS bias current transistor having its drain connected to the source of the first transistor, its source connected to a negative voltage supply, and its gate connected to a control voltage source.

Also disclosed are distortion suppression networks which can be added to the above circuit to reduce distortion at high input signal levels and an alternate variable resistance network controlled by the same control voltage and containing a resistance branch between the common node of the first and second capacitors and the input of the operational amplifier.

6 Claims, 4 Drawing Figures

AMPLIFIER WITH CONTROLLED GAIN

TECHNICAL FIELD

The invention relates to amplifiers having a gain which can be varied in response to a control voltage applied to a feedback network.

BACKGROUND OF THE INVENTION

It is known to provide an amplifier with a variable transconductance feedback network so that the gain of the amplifier can be varied in response to a control voltage applied to that network. Such arrangements are commonly used in automatic gain control circuits and in amplifiers with a programmable gain.

In a circuit which is constructed with MOS (metal-oxide semiconductor) technology, it is often difficult to obtain a variable transconductance network with a wide enough range of values for a sufficient range of gain control with essentially undistorted signal transmission. As a result, the circuit has a severely restricted range or requires too much power or chip area.

SUMMARY OF THE INVENTION

The novel controlled gain amplifier of the present invention has its feedback controlled by a switched capacitor variable transconductance network which includes first and second through-switched capacitors connected in series between the input and output ports of the amplifier and at least one variable resistance means connected from the common node of the capacitors to at least one reference potential. This arrangement affords accurate control of the signal-band gain over a wide gain range with relatively low distortion while using low power consumption devices which require a relatively small amount of area on an integrated circuit chip.

The variable resistance means may also be provided with a network for suppressing distortion when the bias current in a transistor contained in the variable resistance means is low, in this case corresponding to a high input signal level to the amplifier.

DESCRIPTION OF THE PREFERRED EMBODIMENT

Figure 1:
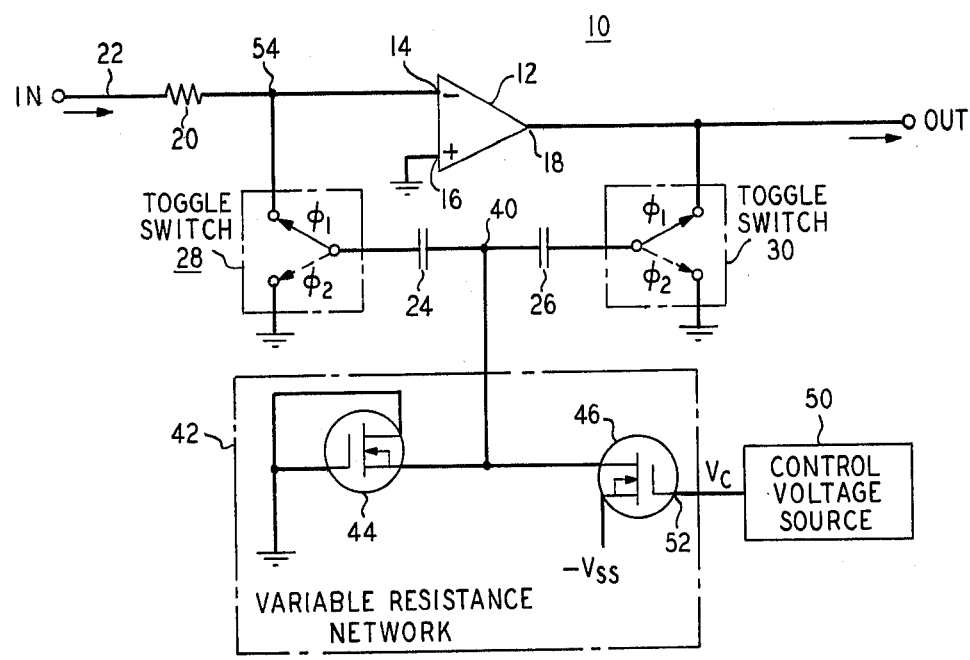
FIG. 1 is a schematic circuit diagram of a controlled gain amplifier in accordance with a preferred embodiment of the present invention having a switched capacitor variable transconductance feedback network. It is in a first phase $\phi_1$ condition with switches labeled $\phi_1$ "on"

The controlled gain amplifier 10 of FIG. 1 is realized with N-channel MOS devices and includes a primary operational amplifier 12 having an inverting input port 14, a non-inverting input port 16, and an output port 18. The non-inverting input port 16 is connected to a reference potential, which in this particular instance is ground potential. The term "reference potential" as used herein means a potential which is substantially constant as compared to the signal potential. An input resistor 20, which accepts a signal 22 from a signal source, is connected to the inverting input port 14. The signal source is not shown, and the resistor 20 may also be realized as a switched capacitor. The particular circuitry of the operational amplifier 12 itself is not material, and can be in accordance with one of various arrangements which are well known to those of ordinary skill in the art of amplifiers.

A first through-switched capacitor 24 and a second through-switched capacitor 26 are connected in series between the inverting input port 14 and the output port 18 of the amplifier 12. The term "through-switched" as used herein describes a two-terminal component of a switched-capacitor circuit as having neither terminal directly connected to ground in one of the two switching phases. A first toggle switch 28 connected in series between the inverting input port 14 and the first capacitor 24 is adapted to switch the inverting input port 14 side of the first capacitor 24 alternately between the inverting input port 14 and ground. A second toggle switch 30 connected in series between the amplifier output port 18 and the second capacitor 26 is adapted to switch the amplifier output port 18 side of the second capacitor 26 alternately between the amplifier output port 18 and ground.

Figure 2:
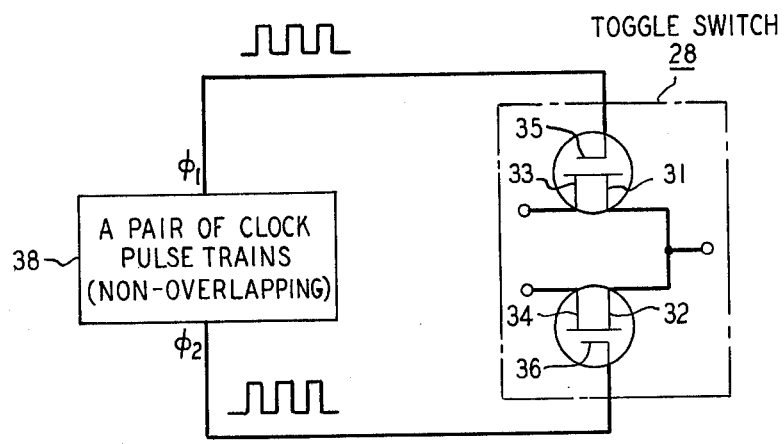
FIG. 2 is a schematic circuit diagram of a toggle switch such as is used in the feedback network of the amplifier of FIG. 1. It is made up of a pair of MOS transistor switches. One switch is "on" in a first phase period $\phi_1$ and the other switch is "on" during a non-overlapping second phase period $\phi_2$.

The first toggle switch 28, which is similar to the second toggle switch 30, is shown in more detail in FIG. 2. It is a pair of enhancement mode MOS transistors 31, 32 with their respective sources 33, 34 connected together and their respective gates 35, 36 connected to a clock source 38 which supplies first phase $\phi_1$ and second phase $\phi_2$ non-overlapping pulse trains to them at a pulse rate $f_c$ which is here chosen to be 112 kHz (kilohertz). The $\phi_1$ phase notation adjacent the solid line arrows in FIG. 1 indicates that the switches 28, 30 as shown are in the $\phi_1$ condition.

A variable resistance network 42, shown within the largest broken line rectangle of FIG. 1, couples the common node 40 of the capacitors 24, 26 to ground. It includes an enhancement mode MOS dynamic resistance element transistor 44 with drain and gate grounded. Its source is connected to the capacitor common node 40 and to the drain of an enhancement mode MOS transistor 46, which has its source coupled to a negative supply voltage $-V_{ss}$ and acts as a controlled current source. A control voltage $V_c$ from a control voltage source 50 is supplied to the gate 52 of the current source transistor 46 to vary the resistance of the variable resistance network 42 by changing the bias current for the resistance element transistor 44.

In the operation of the controlled gain amplifier 10, the control voltage $V_c$ applied to the gate 52 of the current source transistor 46 determines the bias current for the resistance element transistor 44 to thereby determine the resistance between the common node 40 and ground. Since this resistance determines the discharge rate to a constant potential of the capacitors 24, 26, the charge packet transferred between the capacitor 24 and the inverting input port 14 of the amplifier 12 in one cycle of operation can thereby be controlled by the control voltage $V_c$. This charge packet is added to the input signal 22 at a summing node 54 to provide negative feedback proportional to the output voltage of the amplifier 12.

Figure 3:
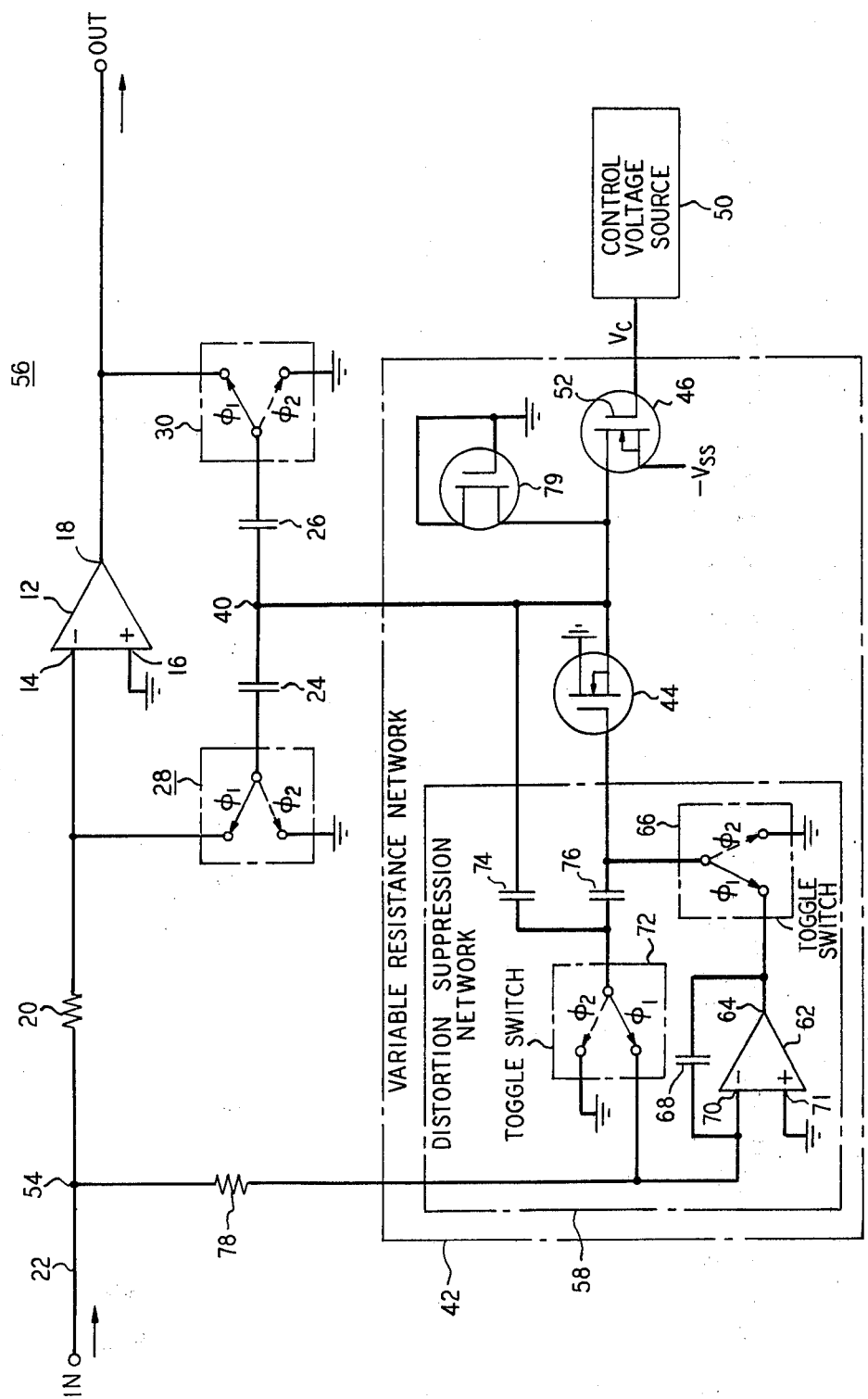
FIG. 3 is a schematic circuit diagram of the amplifier of FIG. 1 with its feedback network modified to include a distortion suppression network for high amplitude input signals.

In another embodiment, shown in FIG. 3, a controlled gain amplifier 56 includes a distortion suppression network 58 within the smaller broken line rectangle. This network 58 suppresses signal distortion which can result from a low bias current condition in the resistance element transistor 44, a condition corresponding to high amplitude input signals, by essentially extending the range of resistance values which the resistance element transistor 44 can present without unduly distorting the waveshape of the output signal which is fed back through the capacitor 24.

The network 58 includes a secondary operational amplifier 62. The gate of the transistor 44 is connected through a toggle switch 66, alternately to the output port 64 of the secondary operational amplifier 62 and ground. A resistance element 78 couples the signal input 22 to an inverting input port 70. The non-inverting input port 71 of the secondary amplifier 62 is grounded. A second toggle switch 72 connects one side of two capacitors 74, 76 alternately between ground and the inverting input port 70 of the secondary amplifier 62. The other side of the first capacitor 74 of these two is connected to the common node 40, while that of the second capacitor 76 is toggled between the output node 64 of the amplifier 62 and ground. The drain of the resistance element transistor 44 is connected either to ground or to a positive supply voltage. A non-switched feedback capacitor 68 couples the output port 64 to the inverting input port 70 of amplifier 62, serving to limit the bandwidth of the secondary amplifier 62. A feedback capacitor may likewise be applied across the primary amplifier 12 for a similar purpose.

The variable resistance network 42 includes a third transistor 79 which serves to extend the resistance range to lower values for a given upper limit on the control voltage.

Figure 4:
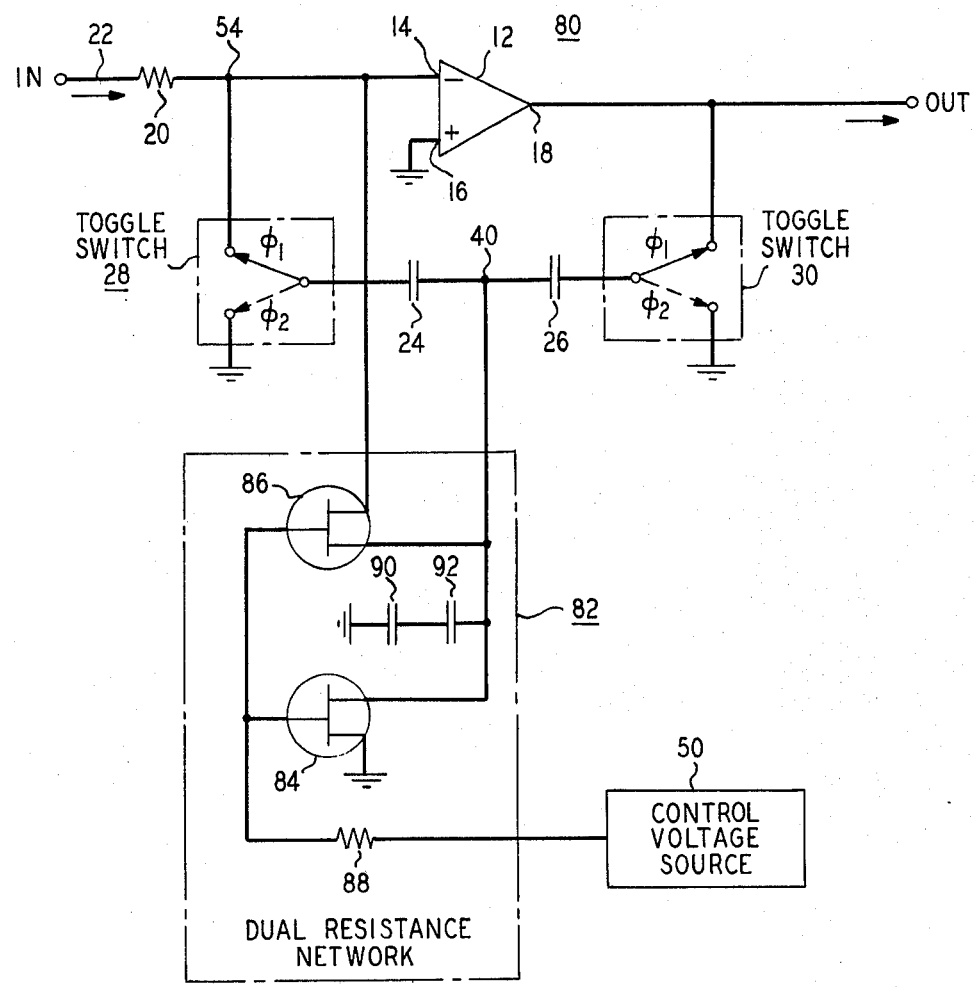
FIG. 4 is a schematic circuit diagram of a controlled gain amplifier in accordance with another embodiment of the invention including a dual variable resistance network.

Another embodiment of the invention is the controlled gain amplifier 80 of FIG. 4, which includes a dual resistance network 82. The network 82 connects the common node 40 to ground through a resistance path provided by transistor 84 which presents a resistance varying in response to a control voltage $V_c$. It also connects the common node 40 to the inverting input 14 of the operational amplifier 12 through another resistance path provided by a transistor 86 which presents a resistance also varying in response to the control voltage $V_c$. The inverting input 14 is a reference potential in that it is a virtual ground node which does not significantly change potential for small signals. The gate electrodes of the transistors 84, 86 are coupled to the control voltage source 50 through a fixed resistor 88. Two capacitors 90, 92 of equal values serve to suppress distortion in the transistors 84, 86 resulting from large signal amplitudes.

The consolidation of the two control voltage-responsive resistance paths in the dual resistance network 82 permits some shared function economizing of elements. However, it would also be feasible to use two separate resistance networks to make the connections. Moreover, a controlled gain amplifier in accordance with the invention can be realized in a number of different ways by providing various control voltage-responsive resistance connections from the common node 40 to a reference voltage in such a manner that the feedback current of the amplifier 12 is thereby affected by the control voltage $V_c$. The resistor 88 and other resistors can also be replaced in known ways with switched capacitor arrangements.

A typical implementation for the variable gain amplifiers 10, 56 would be an AGC (automated gain control) circuit. In such a circuit, the control voltage $V_c$ would be derived from the output 18 of the amplifier 12 by detecting the signal peaks and passing them through a low-pass filter with a positive dc voltage output bias and having appropriate slew capabilities (fast for attack and slow for recovery, i.e., fast in the process of increasing gain and slow in the process of decreasing gain).

The particular values of the various circuit components in the variable gain amplifiers 10, 56 are necessarily specific to the implementation intended and can be readily ascertained by one skilled in the art of integrated circuit amplifier design.

The above variable gain amplifiers 10, 56 could also be realized by the use of P-type MOS devices connected in a "mirror-image" fashion as compared to the devices of the amplifiers 10, 56, to reflect their opposite device polarity.

While in the circuit diagrams for the amplifiers 10, 56, 80 ground potential and the virtual ground potential of the inverting input port 14 are used as the reference potentials, an amplifier in accordance with the invention can be readily designed by one skilled in the art of amplifiers to use other reference potentials which may be available for a particular circuit application.

The feedback network of an amplifier can also include an inverter and be connected between the output and the non-inverting input.

What is claimed is:

1. A controlled gain amplifier of the type having a first operational amplifier with an inverting input port for receiving a signal from a signal source, a non-inverting input port, an output port, and a negative feedback network connected between one of said input ports and said output port, said feedback network changing its transconductance in response to a control voltage from a control voltage source, characterized in that said feedback network is a switched capacitor network comprising:

first and second capacitors connected in series between one of said input ports and said output port;
a first switch means responsive to a pair of non-overlapping pulse trains corresponding to first and second phase periods to connect one side of said first capacitor to said one input port of said first amplifier during said first phase period and to a reference potential during said second phase period;
a second switch means responsive to said pulse trains to connect one side of said second capacitor to said output port of said first amplifier during said first phase period and to a reference potential during said second phase period; and
variable resistance means responsive to said control voltage and providing at least one current path from a common node of said first and second capacitors to a reference potential.

2. The amplifier of claim 1 wherein said variable resistance means comprises:

a first transistor connected to provide a dynamic resistance path between said first and second capacitors and a reference potential; and
a second transistor connected between said first transistor and a supply voltage source and having said control voltage applied to its control electrode to provide for said first transistor a bias current which varies in response to said control voltage.

3. The amplifier of claim 2 including a distortion suppression network responsive to said signal and connected to a control electrode of said first transistor for reducing output signal waveshape distortion at high input signal levels, said suppression network comprising:
- a first impedance connected between said inverting input and said signal source;
- a second operational amplifier having an inverting input port connected to said signal source through a second impedance, its non-inverting input port being connected to a reference potential;
- third and fourth capacitors connected together at one side to form a common node, the other side of said third capacitor being connected to said common node of said first and second capacitors, and the other side of said fourth capacitor being connected to said control electrode of said first transistor;
- third switch means responsive to said non-overlapping pulse trains to switch said control electrode of said first transistor so that during said first phase it is connected to said output port of said second operational amplifier and during said second phase period it is connected to a reference potential;
- fourth switch means responsive to said non-overlapping pulse trains to switch said common node of said third and fourth capacitors so that during said first phase it is connected to said inverting input port of said second operational amplifier and during said second phase it is connected to a reference potential; and
- a fifth capacitor connected between said inverting input and output ports of said second operational amplifier.

4. The amplifier of claim 3 wherein said transistors are field effect transistors.

5. The amplifier of claim 3 wherein said transistors are MOS devices.

6. The amplifier of claim 1 comprising a second variable resistance means responsive to said control voltage and providing a current path from said common node of said first and second capacitors to said inverting input port of said first operational amplifier.

* * * * *